US011688582B2

United States Patent
Hyde et al.

(10) Patent No.: US 11,688,582 B2
(45) Date of Patent: Jun. 27, 2023

(54) NAVIGATION FOR ELECTRON MICROSCOPY

(71) Applicant: OXFORD INSTRUMENTS NANOTECHNOLOGY TOOLS LIMITED, Oxon (GB)

(72) Inventors: Anthony Hyde, Buckinghamshire (GB); James Holland, Buckinghamshire (GB); Simon Burgess, Buckinghamshire (GB); Peter Statham, Buckinghamshire (GB); Philippe Pinard, Buckinghamshire (GB); James Corrin, Buckinghamshire (GB)

(73) Assignee: Oxford Instruments Nanotechnology Tools Limited, Abingdon (GB)

( * ) Notice: Subject to any disclaimer, the term of this patent is extended or adjusted under 35 U.S.C. 154(b) by 381 days.

(21) Appl. No.: 16/632,835

(22) PCT Filed: Jul. 19, 2018

(86) PCT No.: PCT/GB2018/052050
§ 371 (c)(1),
(2) Date: Jan. 21, 2020

(87) PCT Pub. No.: WO2019/016559
PCT Pub. Date: Jan. 24, 2019

(65) Prior Publication Data
US 2021/0151287 A1 May 20, 2021

(30) Foreign Application Priority Data
Jul. 19, 2017 (GB) ...................................... 1711621

(51) Int. Cl.
*H01J 37/28* (2006.01)

(52) U.S. Cl.
CPC ....... *H01J 37/28* (2013.01); *H01J 2237/2602* (2013.01); *H01J 2237/28* (2013.01)

(58) Field of Classification Search
None
See application file for complete search history.

(56) References Cited

U.S. PATENT DOCUMENTS 5,142,147 A 8/1992 Kawamata et al.
5,357,110 A 10/1994 Statham
(Continued)

FOREIGN PATENT DOCUMENTS

CN 103681189 A 3/2014
CN 106165055 A 11/2016
(Continued)

OTHER PUBLICATIONS

Mott et al., "Saving the photons: mapping X-rays by position-tagged spectrometry", Journal of Microscopy, vol. 193, Jan. 1, 1999, pp. 2-14.
(Continued)

*Primary Examiner* — Andrew Smyth
(74) *Attorney, Agent, or Firm* — Blank Rome LLP (57) ABSTRACT

A method and system for analyzing a specimen in a microscope are disclosed. The method comprises: acquiring a series of compound image frames using a first detector and a second detector, different from the first detector, wherein acquiring a compound image frame comprises: causing a charged particle beam to impinge upon a plurality of locations within a region of a specimen, the region corresponding to a configured field of view of the microscope, the microscope being configured with a set of microscope conditions, monitoring, in accordance with the configured microscope conditions, a first set of resulting particles
(Continued)

generated within the specimen at the plurality of locations using the first detector so as to obtain a first image frame, monitoring, in accordance with the configured microscope conditions, a second set of resulting particles generated within the specimen at the plurality of locations using the second detector, so as to obtain a second image frame, wherein each image frame comprises a plurality of pixels corresponding to, and derived from the monitored particles generated at, the plurality of locations within the region, for each pixel of the second image frame, if the configured microscope conditions are the same as those for a stored second image frame of an immediately preceding acquired compound frame in the series, and if the respective pixel corresponds to a location within the region to which a stored pixel comprised by said stored second image frame corresponds, combining said stored pixel with the pixel so as to increase the signal-to-noise ratio for the pixel, and combining the first image frame and second image frame so as to produce the compound image frame, such that the compound image frame provides data derived from, for each of the plurality of pixels, the particles generated at the corresponding location within the region and monitored by each of the first detector and second detector; and displaying the series of compound image frames in real-time on a visual display.

27 Claims, 4 Drawing Sheets

(56) References Cited

U.S. PATENT DOCUMENTS

| | | | |
|---|---|---|---|
| 6,528,787 | B2 | 3/2003 | Katagami et al. |
| 2003/0089851 | A1 | 5/2003 | Katagami et al. |
| 2008/0035843 | A1 | 2/2008 | Hatano et al. |
| 2009/0020698 | A1 | 1/2009 | Muto et al. |
| 2012/0207397 | A1 | 8/2012 | Nagatomo et al. |
| 2015/0046097 | A1* | 2/2015 | Gohil ................. G06T 7/11 702/32 |
| 2015/0348749 | A1 | 12/2015 | Lang et al. |
| 2017/0017011 | A1* | 1/2017 | Howard ............ G01N 15/088 |

FOREIGN PATENT DOCUMENTS

| | | |
|---|---|---|
| EP | 3173025 A1 | 5/2017 |
| JP | 3-34249 | 2/1991 |
| JP | 3-190046 | 8/1991 |
| JP | 2004-226309 | 8/2004 |
| JP | 2009-26621 | 2/2009 |
| WO | WO 2012/039206 A1 | 3/2012 |
| WO | WO2012110754 A1 | 8/2012 |
| WO | WO2014188186 A1 | 11/2014 |

OTHER PUBLICATIONS

English translation; Chinese Publication No. CN106165055; Publication Date: Nov. 23, 2016; 19 pages.
English translation; Chinese Publication No. CN103681189; Publication Date: Mar. 26, 2014; 20 pages.

* cited by examiner

NAVIGATION FOR ELECTRON MICROSCOPY

RELATED APPLICATIONS

This application is a U.S. National Stage Application of International Application No. PCT/GB2018/052050, filed on Jul. 19, 2018, which claims priority of Great Britain Application No. 1711621.1, filed on Jul. 19, 2017. The entire contents of those applications are incorporated herein by reference.

FIELD OF THE INVENTION

The present invention relates to a method for analyzing a specimen in a microscope, and to a system for analyzing a specimen. In particular it may provide a user with improved navigation around the specimen, and may help a user by combining information from multiple signals, even those with poor signal-to-noise, and providing a display that allows the user to interact with the information sources in order to explore over a large area efficiently and effectively.

BACKGROUND TO THE INVENTION

Figure 1:
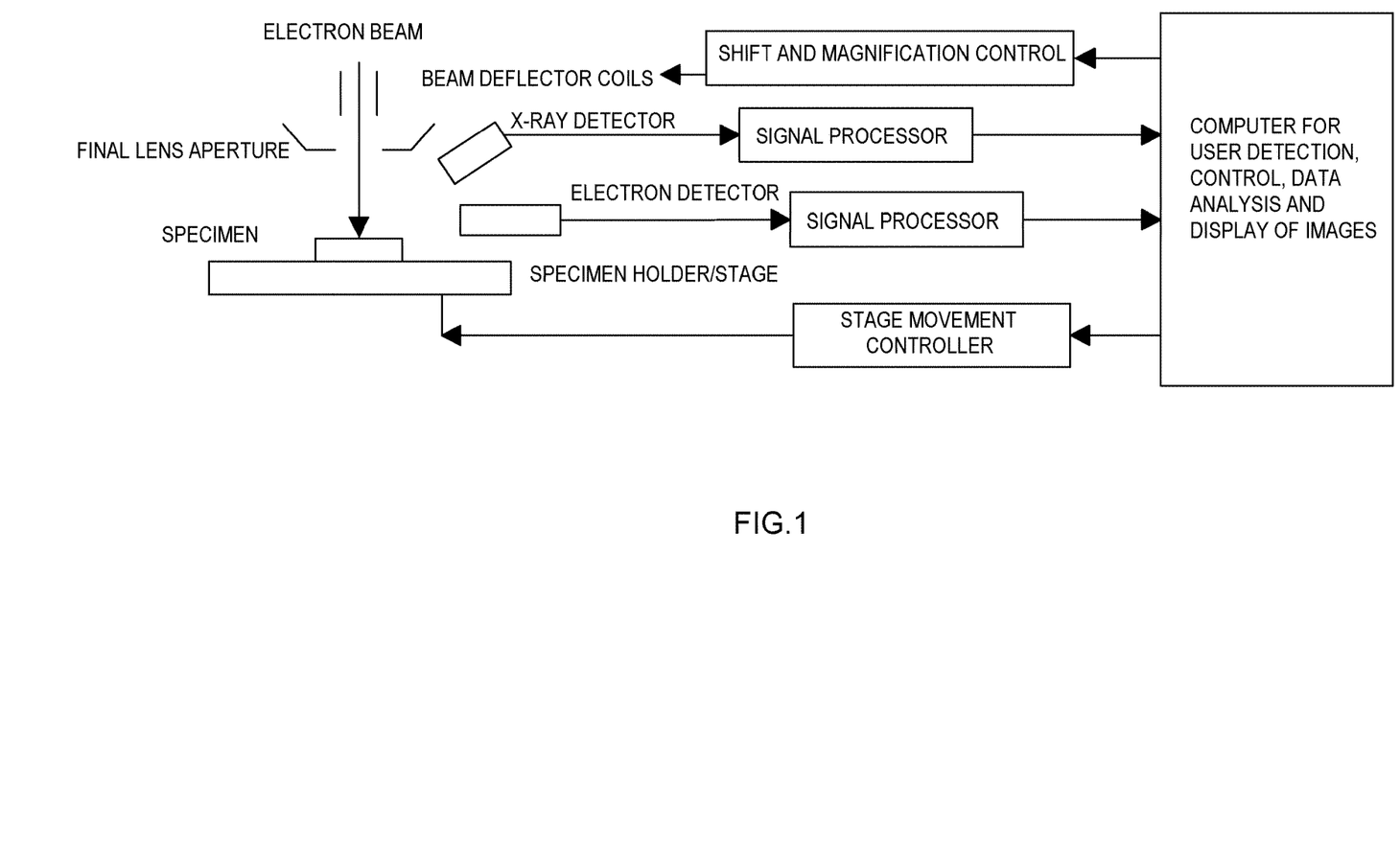
FIG. 1 is a schematic diagram showing the configuration of a scanning electron microscope system for recording electron and X-ray images from a specimen in accordance with the prior art.

FIG. 1 shows a typical system that is employed in a scanning electron microscope (SEM) for exploring the surface of a specimen. The electron beam is produced inside an evacuated chamber and usually focussed with a combination of magnetic or electrostatic lenses. When the beam strikes a specimen, some electrons are scattered back from the specimen (backscattered electrons or BSE) or interact with the specimen to produce secondary electrons (SE) and a number of other emissions such as X-rays.

An electron detector, typically designed to respond to the intensity of either SE or BSE from the specimen, is connected to signal processing electronics and produces a signal corresponding to that part of the specimen that is being struck by the focussed beam. X-ray photons emitted from that part of the specimen will also strike an X-ray detector and with associated signal processing, individual photon energies can be measured and signals generated that correspond to the characteristic emission lines for chemical elements present under the beam. The focussed electron beam is scanned using a beam deflector over a grid of points on the specimen, typically in raster fashion line-by-line (but can be in any order and even a randomised selection of points) and at each point the electron signal is measured and stored in the corresponding pixel of a digital image that is typically displayed on a video display unit interfaced to a computer. When all points in the grid have been accessed, one complete "frame" of image data has been acquired. Typically the grid of points covers a "field of view" up to 1 cm in dimension but this can be larger or considerably smaller and if the image is displayed on a fixed size monitor, the size of the field of view effectively determines the magnification so that a smaller field of view represents higher magnification. A specimen to be examined is typically much larger in dimension than the maximum field of view that can be achieved by deflection of the electron beam and to explore the complete specimen surface it is usually necessary to move the holder or stage that supports the specimen using a controller and this can typically move the scanned field of view by many cm. A similar system is used in an electron microscope where the specimen is thin enough for the beam to be transmitted through the specimen (scanning transmission electron microscope or STEM). In this case, the range of beam deflection and stage movement is typically less than that for a SEM.

When an electron beam strikes a specimen, the number of electrons emitted from the specimen is typically a few orders of magnitude higher than the number of X-ray photons generated. Consequently, the X-ray images generally have much poorer signal-to-noise (S/N) ratio than the electron image and it is desirable to use the best available methods to improve the X-ray images. The number of X-rays collected by a detector is governed by the solid angle subtended by the X-ray detector at the point where the electron beam strikes the specimen. For an arrangement as shown in FIG. 1 where the X-ray detector is to one side of the electron beam, the collection solid angle is maximised by using a large area detector or positioning the detector very close to the specimen. In a different arrangement, the X-ray detector uses a number of sensors that are disposed around the incident electron beam to maximise the total collection solid angle. In this "coaxial" arrangement, the X-ray detector is positioned between the final lens aperture and specimen and the electron beam travels through a gap between the sensors.

Even when the collection solid angle is maximised, the signal-to-noise for the X-ray images for a single frame is typically much worse than for the electron image and this makes it difficult for the user to see detail in a single frame of data when the dwell time per pixel is short. If the dwell time is extended to improve signal-to-noise, the time to complete an image frame is increased and the user has to wait longer to see an image that covers the whole field of view. A significant innovation for X-ray imaging was the technique of recording both the scan position and energy of individual photons so that the stored data could be processed to generate X-ray images from any desired characteristic chemical element emission (Mott and Friel, 1999, Journal of Microscopy, Vol. 193, Pt 1, January 1999, pp. 2-14). Rather than use a large dwell time per pixel for a single scan, Mott and Friel used a small dwell time and repetitively scanned the same field of view while continually accumulating data. Their system was programmed to repetitively prepare X-ray images for display using the accumulated data so that as new frames of data were added, the X-ray element maps appeared progressively less grainy and detail and shading began to appear. This method of acquiring and displaying X-ray element maps and observing the resulting images improve with time has now been in common use for almost two decades.

When a user needs to explore a specimen to find interesting regions, they typically use the SEM display that has been optimised for fast interaction with electron images. The SEM usually displays a high S/N electron image that is refreshed every frame and uses a fast frame rate so that if the focus or magnification is changed or the field of view is shifted (for example by moving the holder or stage that supports the specimen or adding an offset to the scan deflection) the user sees the new image at a rate fast enough to interact efficiently. An update rate high enough to track a moving feature is typically referred to as "TV rate" by analogy with a domestic television even though the frame rate may be lower than 50 Hz. After setting the magnification of the electron image so that the field of view covered by the electron beam scan is suitable for displaying the type of features of interest on the specimen surface, the user will move the stage while observing the electron image to find an area that is likely to contain chemical elements or compounds that are of interest. When a likely area appears in the field of view, the user will stop stage movement then adjust the scan rate and start an X-ray acquisition and observe the element maps as the S/N improves frame by frame as described by Mott and Friel. If it soon becomes apparent that the distribution of elements or compounds in the field of view is not suitable, the user will return to interactive exploring using a fast frame rate electron image and moving the stage to find a more suitable region for acquiring X-ray data. This cycle of returning to the electron image to explore, periodically stopping to acquire sufficient X-ray data to check if the field of view has a suitable distribution of required elements and if not, returning to the electron image to explore, is inefficient and the user may also miss regions on the specimen that contain the materials of interest while they attempt to navigate over a large area on the specimen.

When the task of a user is to find regions containing particular chemical elements or compounds or materials with certain properties, the problem is that the electron image does not provide enough information. The SE signal shows up topography well and the BSE signal can indicate average atomic number of materials but neither signal provides specific information on chemical element content or material properties so the user has to guess whether a region is likely to be worth acquiring additional data to provide such information. The X-ray image can provide information on chemical element content but has poor S/N and doesn't provide any detail of topography so does not give enough visual clues to help the user know where they are on the specimen. What is therefore needed is an improved method for the user to navigate over large areas on a specimen to find materials of interest.

SUMMARY OF THE INVENTION

In accordance with a first aspect of the invention there is provided a method for analyzing a specimen in a microscope, the method comprising: acquiring a series of compound image frames using a first detector and a second detector, different from the first detector, wherein acquiring a compound image frame comprises: a) causing a charged particle beam to impinge upon a plurality of locations within a region of a specimen, the region corresponding to a configured field of view of the microscope, the microscope being configured with a set of microscope conditions, b) monitoring, in accordance with the configured microscope conditions, a first set of resulting particles generated within the specimen at the plurality of locations using the first detector so as to obtain a first image frame, c) monitoring, in accordance with the configured microscope conditions, a second set of resulting particles generated within the specimen at the plurality of locations using the second detector, so as to obtain a second image frame, wherein each image frame comprises a plurality of pixels corresponding to, and having values derived from the monitored particles generated at, the plurality of locations within the region, d) for each pixel of the second image frame, if the configured microscope conditions are the same as those for a stored second image frame of an immediately preceding acquired compound frame in the series, and if the respective pixel corresponds to a location within the region to which a stored pixel comprised by said stored second image frame corresponds, combining the value of said stored pixel with the value of the pixel so as to increase the signal-to-noise ratio for the pixel, and e) combining the first image frame and second image frame so as to produce the compound image frame, such that the compound image frame provides data derived from, for each of the plurality of pixels, the particles generated at the corresponding location within the region and monitored by each of the first detector and second detector; and displaying the series of compound image frames in real-time on a visual display.

The method can provide the advantage of displaying in combination microscope images of a specimen acquired using two different types of detector and thus having different image acquisition properties and representing different information about a specimen, in real-time as the images are acquired. This can greatly increase the speed and efficiency with which a user of the microscope equipment can navigate through different regions of the specimen and locate features of interest thereupon. This improvement arises not least because displaying the two types of image showing the same region of the specimen in the same field of view at the same time can allow a user to rapidly identify potential features of interest based upon images of the first type, which may show the physical shape or topography of the specimen surface, for example, while navigating around the specimen, and upon locating such potential features, maintain the field of view of the microscope so that it continues to include these features, so as to acquire or accumulate image data of the second type, so as to obtain information about that region of the specimen of a different type to the information provided by the first image type.

The method may be used in analyzing a specimen in any charged particle beam instrument, or an instrument that uses a focussed particle beam. Accordingly, in this disclosure, the term microscope is used to refer to any such instrument. Typically, the microscope is an electron microscope, wherein the charged particle beam is an electron beam. In other embodiments, the charged particle beam is an ion beam.

Furthermore, the display of the combined first and second image types in the compound image frame in real-time as the series of compound images are acquired means that such actions can be performed "on the fly", without pausing or interrupting the navigation of the specimen by the user.

It will be understood that the term "particles" as used in this disclosure includes particles of matter, including ions and subatomic particles such as electrons, as well as particles representing quanta of electromagnetic radiation, namely photons, for example, X-ray photons. In some embodiments, for instance, the charged particle beam is an ion beam, which typically causes resultant particles including electrons and ions to be emitted from a specimen, which can be monitored by the detectors.

The method is particularly beneficial in embodiments wherein the second detector is of a type that monitors signals typically having a lower signal-to-noise ratio than the signals that the first detector is adapted to monitor, under given microscope conditions. In such embodiments, the combination of first and second detectors may be chosen such that the first detector provides high signal-to-noise ratio image signals quickly, in order to allow a user to rapidly inspect different regions of a specimen. In navigating around the specimen by moving the field of view across different regions thereof, the second, lower signal-to-noise ratio detector may provide poorer quality second image frames than the first image frames obtained by the higher-signal first detector. However, when the user slows the rate of navigation or rate of change of field of view, or stops navigating so as to maintain a fixed field of view, repeat measurements for the same pixels or locations on the specimen may be acquired by the detectors, and so, by combining pixels from the second image frame with those of previously acquired second image frames corresponding to the same locations in the specimen, the lower signal-to-noise ratio of images acquired using the second detector can be alleviated, and higher-quality images derived from data acquired by the second detector may be obtained.

In some embodiments, each image frame comprises a plurality of pixels corresponding to, and having values representing the monitored particles generated at, the plurality of locations within the region. For example, a pixel value may represent the intensity of particles monitored by a detector and generated at the corresponding location. Consequently, the compound image frame may, in some embodiments, provide data representing, for each of the plurality of pixels, the particles generated at the corresponding location within the region and monitored by each of the first detector and second detector. In other embodiments, such as those wherein an image frame is an electron backscatter diffraction image, the pixel values may not directly represent the generated particles at the locations, but may rather be derived therefrom, by way of calculation.

Typically each of the first detector and the second detector views the region of the specimen under or according to the configured set of microscope conditions. In each of the obtained first and second image frames, each pixel may represent, or have a value according to, a count of the particles monitored by the detector generated at a location on the sample corresponding to that pixel, or, for example, may indicate the energy distribution of those monitored particles.

In some embodiments, during the acquiring of a compound image frame, the combining of the respective second image frame with the stored image frame may be performed automatically depending upon the field of view being the same as that for the stored second image frame. In particular, if the configured field of view is the same as the field of view configured for an immediately preceding acquired compound frame in the series, or if, for example, the pixel in question lies in a region of overlap between those two second image frames, the pixel may be combined with the stored pixel.

During the combination process for the second image frame, the configured microscope conditions being the same as those for a stored second image frame may be thought of as the content of the signal acquired for the pixel being the same. For example, if no change is made between acquiring the second image frame in question and the stored image frame to the focus, astigmatism, magnification, acceleration voltage of the electron beam or other type of charged particle beam, beam current, brightness, or contrast, the measurement for the pixel will typically constitute a repeat measurement of the stored pixel value for that location on the specimen, unless the specimen or the scan position has moved, and so can be used to improve the signal-to-noise ratio for that pixel. In other words, the configured microscope conditions being the same maybe thought of as the microscope conditions in accordance with which the second image frame was acquired being the same as the microscope conditions in accordance with which the stored second image frame was acquired.

The displaying of the compound image frames in real-time typically comprises processing and displaying the image data as soon as it is acquired, so that it is available virtually immediately. In this way, a user is able to use the real-time compound image frames as feedback to guide the navigation around the specimen. In other words, the real-time presentation of the compound image frames may constitute there being no noticeable delay between the acquiring of a particular image frame and its display upon the visual display. For example, if a user halts navigation and maintains the field of view at the same region of the specimen, the real-time display typically means that there is substantially no noticeable delay between the user halting navigation and the user being presented, on the visual display, with the previously changing field of view stopping upon the relevant region. Thus the method may involve displaying the acquired series of compound image frames in real-time, or "live", and this may involve processing and displaying the images within a short time period, most preferably of the order of milliseconds. However, it is also envisaged that the method may be beneficial with a range of time periods between acquiring first and second image frames and presenting the corresponding compound image frame on the visual display. These frame time periods may, for example, be 1 s, 0.3 s, 0.05 s, or 0.01 s. Preferably, the series of compound image frames are displayed in the order in which they were acquired.

The method offers therefore the user an improved approach for navigation without compromising the ability see a good S/N image as early as possible. The microscope user is typically provided with a display that combines an image that gives good visual representation of sample shape and form with additional information on material content or properties obtained from other detectors. The display may be presented so that the user can see the images simultaneously, either side-by-side or preferably overlaid in the same position using colour mixing.

The detectors can obtain images of the region by way of the beam being scanned across the locations in the region. Typically, to obtain the images, a focussed electron beam is positioned, using the microscope beam deflector, at one point in a field of view and a signal from an electron detector is measured at that position and additional signal measurements are obtained from one or more additional detectors while the beam is in that position. The result for each signal source can be used as the intensity value for the "pixel" position in the digital image for that source that corresponds to the beam position on the specimen. The beam is then typically deflected to a new position and a new signal result recorded for the corresponding pixel in the digital image for each source. This process can continue until the beam has accessed positions that cover a typically rectangular field of view so that a single "frame" of digital image data corresponding to that field of view is recorded for every signal. The signal data from the electron detector thus gives rise to a digital "electron image" and the data from the additional detectors is processed to provide one or more additional images that are from the same field of view on the specimen as the electron image but provide additional information on material composition or properties.

Typically, all images are either transferred to a visual display unit and shown side-by-side or combined into a single composite colour image using techniques such as those described in PCT/GB2011/051060, for example so that the user can see all information within their line of vision. As soon as a complete frame of digital data has been recorded for all signals, a new frame of data can be collected. If the field of view or the microscope conditions have not been changed, the new frame of data is typically used to augment the results of previous frames and improve the signal-to-noise for those images using signal averaging or accumulation at each pixel. The improved images can again be transferred to the visual display unit and this cycle of frame acquisition and display repeated so that the user sees a compound image comprising side-by-side images or a single composite image where the signal-to-noise is progressively improved as each new frame of data is acquired. However, if the field of view or microscope conditions changes between frames, any signal-averaged or accumulated data is typically replaced by the data from the new frame.

A change in the field of view may be brought about, for instance, by the user altering the magnification so that the focussed electron beam is deflected over a smaller or larger region on the specimen. Alternatively, the user may move the stage or holder on which the specimen is supported so that the specimen is moved relative to the focussed electron beam and thus the field of view accessed by the deflected electron beam moves to a new region of the specimen surface. The field of view may also be changed by altering the beam deflection so that the focussed electron beam is directed over a grid of points that covers a different region on the specimen. Microscope conditions such as beam voltage may also be altered which will change the contrast in the electron image and also the information content of additional signals. In any of these cases, the instant replacement of the existing image data with the newly-acquired data will allow the user to see the new field of view within a single frame time. If the frame time is sufficiently short, the user will be able to use the visual display unit to track features on the surface of the specimen while the field of view is moving.

If after any frame of data acquisition the field of view or microscope conditions are the same as for the previous frame, then the acquisition mode typically reverts to the signal-averaging or accumulation mode where successive frames of data are used to improve S/N of the displayed images. Thus, in some embodiments, if the user is moving the field of view over the surface of the specimen to find interesting regions, the user will be able to see the combination of the specimen shape and form provided by the electron image and the complementary information on material composition or properties provided by additional signals. As soon as an interesting region comes into view, the user can stop the movement and the signal-to-noise will rapidly improve without any interaction from the user or interruption of the analysis session.

The inventors have discovered that even if an additional signal gives a single frame of data with poor S/N, the image is often enough to give a rough location of interesting regions.

Furthermore, as successive frames are displayed while the field of view is moved, the noise in each frame is different and the eye/brain combination achieves a temporal averaging effect which allows the user to recognise a moving feature that may be obscure in a single frame of data. As soon as the user sees an interesting feature, if they stop the movement, automatically signal-averaging may be started automatically so that the visibility of the feature will improve rapidly after a few frames are recorded.

To achieve this step function improvement in navigation efficiency where the user can take decisions "on the fly", an important advantage is that the user can view both images or more, in embodiments with three or more detectors, simultaneously so that all images are at least within the range of peripheral vision of the user. Preferably, the additional image information on material composition or properties is provided as a colour overlay on the electron image to provide the equivalent of a "heads up" display, that presents additional data without requiring the user to look away from the electron image.

As noted above, the first detector is typically an electron detector. However, it is envisaged that other types of monitoring equipment may be used.

In typical embodiments, the first detector is adapted to monitor resultant particles that provide data including either or both of topographical information and specimen material atomic number information about the region of the specimen. Such data may typically be provided by secondary electron or backscattered electron detectors. Thus such detectors may be suitable for rapidly providing image frames comprising information suitable for use by a user to quickly navigate the field of view around the specimen surface.

In some embodiments, the second detector is adapted to monitor resultant particles that, for the configured microscope conditions, are generated within the specimen at a rate less than one tenth of the rate at which resultant particles that the first detector is adapted to monitor are generated within the specimen. For example when the method is used with an electron microscope, typically, for given electron microscope conditions, resultant emitted X-rays generated in response to an electron beam impinging upon the specimen are generated at a rate that is an order of magnitude or more less than the rate at which emitted electrons are generated. The rate in this context refers to the number of particles generated per second, be those particles comprised of matter or electromagnetic radiation. In some embodiments, the rate at which the particles which the second detector is adapted to monitor are generated is one hundredth that of the rate at which particles that the first detector is adapted to monitor are generated.

In some embodiments, for example involving electron backscatter diffraction analysis, such a difference in first and second particle generation or monitoring rates may not be present.

The second detector may, in different embodiments, be adapted to monitor different types of particles, for example X-rays, secondary electrons, and backscattered electrons.

In some embodiments, the second detector is any of an X-ray spectrometer, an electron diffraction pattern camera, an electron energy loss spectrometer, or a cathodoluminescence detector.

In some embodiments, monitoring the second set of particles so as to obtain the second image frame comprises: obtaining two or more signals of different types from the second detector, so as to obtain a sub-image frame corresponding to each of said signals, and combining the first image frame and second image frame comprises combining the first image frame with one or more of said sub-image frames.

Thus in some embodiments sub-image frames may be obtained by processing the data from the second detector in order to derive different types of information. For example, an X-ray spectrum that provides a measure of the number of photons recorded for each of a set of energy ranges can be processed to measure the number of photons corresponding to particular characteristic line emissions, even when the line emissions are spread over a range of energies such that recorded data from two different line emissions overlaps in terms of energy. In some embodiments, an electron diffraction pattern recorded by a second detector, such as an imaging camera, can be processed to determine the crystalline phase of the material under the electron beam and the orientation of that phase so that the sub images could be generated corresponding to different phases and to different crystalline orientations.

It follows that, in some embodiments, multiple signals may derived from the same detector. Typically in such embodiments, the second detector may output two or more signals of different types, and these may correspond to monitored particles of different types, and may be used to obtain different sub-image frames. For example, different types of signals which may be output may include: a spectrum obtained by an X-ray spectrometer, an electron diffraction pattern obtained by a camera sensitive to electrons, and a spectrum obtained by an electron energy loss spectrometer or a cathodoluminescence detector. Any of these signal types may be used to derive either of the first and second image frames, or may be used to derive a sub-image frame. Accordingly, in some embodiments, monitoring the second set of particles so as to obtain the second image frame comprises: monitoring two or more sub-sets of the second set of particles, each of said sub-sets corresponding to a different type of signal obtained from the second detector, so as to obtain a sub-image frame corresponding to each of said sub-sets.

Some embodiments include a third detector of a different type to the first and second detectors. For example, each of the first, second and third detectors may be any of a secondary electron detector, a backscattered electron detector, and an X-ray detector.

As noted above, a pixel of an image frame may represent, or have a value indicating the energy distribution of the monitored particles. This may be achieved by way of obtaining two or more sub-image frames, that is sub-sets or components of an image frame, each corresponding to a different range of particle energies. Accordingly, in some embodiments, monitoring the second set of particles so as to obtain the second image frame comprises: monitoring two or more sub-sets of the second set of particles, each of said sub-sets corresponding to a different particle energy range, so as to obtain a sub-image frame corresponding to each of said sub-sets, wherein each sub-image frame comprises a plurality of pixels corresponding to, and derived from the monitored particles comprised by the corresponding sub-set and generated at, the plurality of locations within the region, and combining said sub-image frames together so as to produce the second image frame, such that the second image frame provides data derived from, for each of the plurality of pixels, the particles generated at the corresponding location within the region and comprised by each of said sub-sets.

In this way, the second detector may obtain, for each compound image frame, more than one associated image (sub-image frame) so as to monitor resultant particles of different energies, or in different energy bands, separately. The separate sub-images may be combined together in a manner that allows the pixel values or intensities for the plurality of constituent pixels, corresponding to the particle counts for the corresponding specimen locations, for each of the sub-image frames to be distinguished. This may be achieved, for example, by assigning a different colour to, or rendering in a different colour, each of the sub-image frames. This may be performed such that the visible contribution to the resultant colour at a given location or pixel in the second image frame, and consequently in the compound image frame, provides a visual indication of the intensity of monitored particles in the corresponding energy band or sub-set generated at that location.

Thus, in some embodiments, a composite colour second image frame, based on the sub-image frames, may be formed and then combined with the first image frame to form the compound image.

For example, in embodiments wherein the second detector is an X-ray detector, for each compound frame in the series, the second detector monitors the intensity for characteristic emissions of multiple chemical elements, by way of monitoring a plurality of sub-sets of particles the energy ranges of which correspond to the characteristic energies, or energy bands, of those chemical elements. Thus from a single X-ray detector, multiple sub-images are obtained, each sub-image corresponding to a different chemical element.

In some embodiments, the two or more sub-image frames are not combined to form the second image frame, but are instead processed separately, in accordance with step (d) of the method, before being combined, together with the first image frame, to form the compound image frame. Accordingly, it is possible in different embodiments for any of the sub-image frames, or any of the image frames, to be acquired in both "accumulation" and "refresh" modes.

It will be understood that providing the sequence of acquired compound images to the user quickly is of particular importance, accordingly, in preferred embodiments, displaying the series of compound image frames in real-time comprises, for each compound image frame, the elapsed time between the corresponding first and second image frames being obtained, and the compound image being displayed on the visual display is less than 1 second, preferably less than 0.3 seconds, more preferably less than 0.05 seconds.

The combination of the first and second image frames may be performed in any way that preferably allows the user to simultaneously inspect the properties of the specimen across the region as monitored by both of the first and second detectors. In some preferred embodiments, combining the first image frame and second image frame so as to produce the compound image frame comprises overlaying the first and second image frames such that the compound image frame comprises a plurality of pixels, each of which corresponds to one of the plurality of locations within the region and provides data derived from the particles comprised by both the first set and the second set and generated at the respective location.

Thus, for each compound image frame, the first and second image frames may be combined to form a single image frame containing data acquired by both of the first and second detectors. This is preferably indicated visually to a user in a manner that allows the first particle set and second particle set information for each location in an image being displayed to be individually distinguished.

The combination of the first and second image frames performed upon an image frame is typically performed on a pixel-by-pixel basis. Accordingly, combining the first image frame and the second image frame so as to produce the compound image frame typically comprises combining each pixel of the first image frame with a pixel of the second image frame that corresponds to the location within the region to which the respective pixel of the first image frame corresponds. Thus pixels of the first and second image frames that correspond to one another by way of representing the same location within the region of the specimen may have their values added together so as to produce compound pixels forming parts of the compound image frame. Merging the two images into one image in this way may be thought of as overlaying the first image frame with the second image frame such that pixels in the two image frames representing the same regions are added to, that is overlaid on top of, one another.

In order for information from both of the image frames to be visible to a user in the compound image frame in embodiments wherein the two image frames are overlaid with one another to form the compound image frame, it is preferable to use colour mixing. In some embodiments combining the first image frame and second image frame comprises calculating a colour for the compound image pixel that is based on the intensities of the corresponding pixels in the first and second image frames. Typically, first and second image frame combination techniques such as using the first image to govern intensity while the second image governs hue are possible. Such techniques may be more appropriate when showing crystal orientation superimposed on the topographic electron image, for example.

Combining the first image frame and the second image frames may, in some embodiments, comprise assigning a first colour to the first image frame and a second, different colour to the second image frame, such that the compound image frame comprises a colour image wherein the relative intensities at each pixel of the first and second colour represent the particles comprised by the first and second sets of monitored particles, respectively, generated at the corresponding location within the region.

Using such a combination technique, the contribution to the compound image by each of the first and second image frames, and so the contribution by the first and second sets of particles as measured by the first and second detectors respectively, are each visible by way of being assigned a different colour shown in the compound image frame. For example, in embodiments wherein the first detector monitors secondary electrons and the second detector monitors X-rays, the first image frame may be represented by lightness values, in accordance with HSL colour values, for example. In this way the topography of the region of the specimen is visually represented in the form of a greyscale image comprising pixels of varying intensities or shades of grey. The X-ray image may then, for example, be assigned the colour green, such that the information on chemical element content within the region represented by the X-ray image of the second image frame can be overlaid with the greyscale first image frame so that the visual data from the X-ray detector remains visible in green while the topography information from the first detector is shown coincident with the X-ray data in the form of areas of varying shades of light and dark, according to the overlaid greyscale image.

In some other embodiments, rather than overlaying the two image frames, combining the first image frame and the second image frame is performed by displaying the first and second image frames side by side. Thus combining the first image frame and the second image frame so as to produce the compound image frame may comprise juxtaposing the first and second image frames. Preferably, in such embodiments, the two image frames are positioned alongside one another such that they are both visible simultaneously within the field of vision of a user when the compound image frame is displayed on the visual display. In these embodiments, therefore, the compound image frame will typically be at least twice as large, that is comprising at least twice as many pixels, as each of the individual first and second image frames.

The microscope conditions under which the first and second image frames are obtained may comprise a number of different configurable conditions. Those conditions which may be configured for the electron column of the electron microscope may comprise magnification, focus, astigmatism, accelerating voltage, beam current, and scan deflection. That is, the aforementioned list of microscope conditions may be configured for the charged particle beam. The position and orientation may be configured for the specimen, or in particular configured for a specimen stage adapted to hold the specimen. In other words, the spatial coordinates, which may include position in the X, Y, and Z axes in a Cartesian coordinate system, as well as degrees of tilt and rotation of the specimen. Brightness and contrast may be configured for each of the first and second detectors.

Accordingly, a field of view for the electron microscope may typically be configured by way of configuring microscope conditions such as the sample stage position and orientation, the magnification, and the scan deflection, that is the degree of deflection applied to the scanning charged particle beam.

With respect to the conditional combination of the second image frame with stored second image frames, typically any change to any of the microscope conditions that alters the field of view or the content of the detector signals should trigger a refresh of the image, that is the capturing of a second image frame without combining it with a stored image frame, to remove the previously accumulated data from the images displayed to a user, since the stored image frames will no longer be consistent with the data under the new conditions or field of view. However, if the microscope electron column conditions are the same and the coordinates of individual pixels are known, for example because of a known control being applied to the observed field of view on the specimen by known adjustment of stage position or beam deflection, then if there is some overlap of the position of the second image frame with the stored previous second image frame, then typically only the pixels that correspond to the same position on the specimen are combined.

Typically, a change to the field of view occurs primarily when the specimen, or the specimen stage, is moved, or if the region of the specimen which may be being scanned by the charged particle beam is moved on the specimen, for example by changing the scan deflection condition. Any change in the field of the microscope conditions thus typically causes the next measurement of a signal at the same or corresponding pixel position to be used to replace the previous measurement. That is, the second image frame may be captured in "refresh" mode, rather than, "accumulation" mode wherein the combining step occurs. Preferably, therefore, when the field of view is moving by way of the spatial coordinates of the stage being changed for instance, the "refreshed" image display is updated sufficiently quickly for a user observing the displayed series of compound image frames to track moving features on the specimen across the display.

The combination of pixels from an image frame may not necessarily be limited to the second image frame only. In some embodiments, the use of the "accumulation" mode of obtaining image frames may be applied to the first image frames, as well as to the second image frames. That is, the acquiring of a compound image frame may also comprise, for each pixel of the first image frame, if the configured microscope conditions are the same as those for a stored first image frame of an immediately preceding acquired compound frame in the series, and if the respective pixel corresponds to a location within the region to which a stored pixel comprised by said stored first image frame corresponds, combining the value of said stored pixel with the value of the pixel so as to increase the signal-to-noise ratio for the pixel. Applying the signal averaging or accumulation mode of obtaining the image frames to the image from the first detector may be advantageous in embodiments wherein the signal-to-noise ratio of signals from the first detector is low, or lower than a desired threshold.

The frame rate of the visual display, that is the rate at which successive compound images in the series are displayed thereon, may vary between different embodiments, and may be configurable. In some embodiments, the frame rate at which the compound image frames are displayed is at least 1 frame per second, preferably at least 3 frames per second, and more preferably 20 frames per second. In some embodiments, a single compound image frame is processed at any given time. In such embodiments, the example frame rates set out above correspond to compound image acquisition times, or processing time, of 1 second or less, 0.3 seconds or less, and 0.05 seconds or less, respectively.

It is beneficial to display the series of compound image frames at a rate or frequency that allows a user to track specific features on a specimen as those features appear to move continuously across or around the display. This may be achieved, in some embodiments, by the rate at which the series of compound image frames is acquired and displayed being at least 10 frames per second, preferably at least 18 frames per second, more preferably at least 25 frames per second, more preferably still at least 50 frames per second. Preferably, therefore, the series of compound image frames is displayed in the form of a moving image, preferably the display frame rate is equivalent to a video frame rate.

In preferred embodiments, combining said storage pixel with the pixel so as to increase the signal-to-noise ratio for the pixel is performed by way of signal averaging or signal accumulation. The output from a detector may be regarded as a signal, and thus the noise-reduction techniques of signal averaging and signal accumulation, wherein an average or sum over a set of replicate measurements, that is a set of measurements under the same conditions for a given pixel, or a pixel corresponding to a particular location within a region, may be used.

In some preferred embodiments, the method further comprises, during the acquiring of one or more of the series of compound frames: storing data derived from the respective compound frame, and storing field of view data representing the configured field of view of the electron microscope, such that the derived data is associated with the field of view data.

The derived data may comprise, or may be, the compound image frame itself. The derived data may also comprise an accumulation or some other combination of compound image frames acquired for that field of view. The derived data may also comprise one or more parameters indicating material properties of the specimen in the region covered by that field of view. For example, the derived data may comprise parameters that indicate the chemical composition of the specimen material in that region, as derived from an acquired X-ray signal from a detector.

The derived data being associated with the field of view may comprise the derived data being linked to or related to the field of view data, for example in a relational database. The association between the derived data and the field of view data may allow a user to configure the field of view of the electron microscope, for example by navigating by way of moving the specimen stage or by way of beam deflection, so as to revisit a region of the specimen with particular properties or identify the characteristics as indicated by, or derived or calculated from the compound image frame taken when the electron microscope field of view corresponded to that region.

In some such embodiments, the method further comprises acquiring at least one compound image frame of each of a plurality of regions of the specimen, and generating a specimen image comprising the compound image frames of the plurality of regions arranged according to the relative positions of the regions on the specimen, the method further comprising displaying, on the specimen image, indicia at each of one or more of the compound frames according to the stored derived data associated with the field of view corresponding to the respective compound frame.

The display on the specimen image may comprise displaying the indicia as a part of, or overlaid with, each of the one or more compound frames. This may be performed according to the stored derived data associated with the field of view corresponding to the respective compound frame in that the indicia is positioned at, or labels, regions on the specimen in the specimen image.

The indicia may, for example, comprise markers with colours or shapes indicating derived properties such as chemical element composition. Markers may also be present or absent at a given compound frame within the specimen image based upon a configured condition, such as the presence or concentration of an element as derived from an X-ray image or signal corresponding to the relevant region.

Thus, while the user is exploring the specimen by moving the field of view across the surface thereof, the user may come across regions of interest that might be worth more detailed investigation later or may indeed miss the presence of certain materials due to a lapse in concentration. Therefore, whenever the field of view and microscope conditions are stationary, data is typically accumulated from the additional signal sources and that data either saved in its entirety or parameters derived from the data and saved in a database together with coordinates defining the location and dimensions of the field of view. After the exploring session, this database can be interrogated to find locations where the data meets criteria for being "interesting" for the user.

To aid the user in navigating back to a region that contains interesting features, a display can be generated from the database and used to show the value of one or more parameters at the field of view positions that have been visited. Preferably this display covers the full range of movement accessible to the user and for each position where data was recorded displays all the data or parameters derived from the data. Where the fields of view for recorded positions overlap, the data is aggregated in the overlapping regions or combined appropriately to provide an image that will aid the user in identifying the best places for further analysis. Ideally, the additional information will be superimposed on an image of the specimen that covers the full range of movement.

The invention thus provides a synergistic set of functionality that gives the user a step function improvement in productivity when trying to discover the best areas for analysis on a specimen.

In accordance with a second aspect of the invention there is provided a system for analyzing a specimen, the system comprising: a microscope comprising a first detector and a second detector, different from the first detector; a controller unit configured to control the microscope to acquire a series of compound image frames, wherein acquiring a compound image frame comprises: a) causing a charged particle beam to impinge upon a plurality of locations within a region of a specimen in the microscope, the region corresponding to a configured field of view of the microscope, the microscope being configured with a set of microscope conditions, b) monitoring, in accordance with the configured microscope conditions, a first set of resulting particles generated within the specimen at the plurality of locations using the first detector so as to obtain a first image frame, c) monitoring, in accordance with the configured microscope conditions, a second set of resulting particles generated within the specimen at the plurality of locations using the second detector, so as to obtain a second image frame, wherein each image frame comprises a plurality of pixels corresponding to, and having values derived from the monitored particles generated at, the plurality of locations within the region, d) for each pixel of the second image frame, if the configured microscope conditions are the same as those for a stored second image frame of an immediately preceding acquired compound frame in the series, and if the respective pixel corresponds to a location within the region to which a stored pixel comprised by said stored second image frame corresponds, combining the value of said stored pixel with the value of the pixel so as to increase the signal-to-noise ratio for the pixel, and e) combining the first image frame and second image frame so as to produce the compound image frame, such that the compound image frame provides data derived from, for each of the plurality of pixels, the particles generated at the corresponding location within the region and monitored by each of the first detector and second detector; and a visual display configured to receive and display the acquired series of compound image frames in real-time.

Such a system may be suitable for carrying out a method according to the first aspect. The system can facilitate the analysis of a specimen in an electron microscope or other charged particle beam instrument by combining information from multiple signals, and displaying to a user the combined signals in real-time so that the order can navigate over a large area of the specimen rapidly.

In some embodiments, the system is suitable for displaying signals generated while a focussed electron beam in the electron microscope is scanned over a two-dimensional region on the surface of the specimen wherein a first signal is from an electron detector, wherein at least one auxiliary signal is derived from a different detector that provides information on individual chemical element content or material properties other than atomic number, wherein each signal is measured at a two-dimensional array of electron beam positions covering the region and the corresponding pixel array of measurement results constitutes a digital image for a field of view covering the region, wherein a visual display is used to show the digital images for all signals so that the images are within the range of peripheral vision of the user or combined into a single composite colour image, wherein a complete set of pixel measurements covering the field of view for all signals and preparation of the visual display is performed and completed in a short time period, wherein the complete set of pixel measurements for all signals covering the field of view and update of the visual display are repeated continuously, wherein successive measurements of at least one auxiliary signal at the same pixel position are used to improve the signal-to-noise of the measurement at that pixel provided the field of view or microscope conditions are not changing, wherein if there is any change in the field of view or microscope conditions, the next measurement of a signal at the same pixel position is used to replace the previous measurement, wherein the short time period is sufficiently small that image displays are updated fast enough for the observer to identify moving features when the field of view is being altered.

In such embodiments, typically the signal-to-noise of the displayed result of more than one measurement of a signal is improved by using Kalman averaging of the measurements or by summing measurements and altering the brightness scaling according to the number of measurements.

In this way, when repeat measurements for a pixel or a location on the specimen are obtained in multiple, successive second image frames in the series of compound image frames being acquired by the system, a Kalman recursive filter may be used to increase the signal-to-noise ratio using the values of the multiple pixel measurements. In some embodiments, the improvement to the image signal is achieved by adding together the values of successive pixel measurements and adjusting the brightness according to the number of measurements, that is number of frames for which the pixels are being added together by the system.

Typically, the short time period is less than 1 second, preferably less than 0.3 seconds and ideally less than 0.05 seconds. Thus the system may be configured to perform and complete the preparation of the visual display sufficiently quickly for no noticeable delay, or minimal delay to be experienced by a user of the system.

The system may be configured to automatically identify when the field of view is changing, in order to switch from an "averaging" or "accumulating" mode wherein successive frames in a series are added together, to a "refresh" mode. In some embodiments, the field of view is regarded to be changing if the specimen is being moved or the scanned region is being changed intentionally under user control.

In some embodiments, a change in the field of view or microscope conditions is detected by mathematical comparison of a new digital image with one acquired earlier. The system may be configured to compare successive frames in the acquired series in order to identify changes to the field of view. The system may be configured to operate in "refresh" mode for parts of the specimen as they are introduced into the field of view as the user navigates the field of view around the specimen, while operating in "accumulating" mode for parts of the specimen that remain within, while moving within, the field of view.

Typically, an auxiliary signal is derived from, the spectrum obtained by an X-ray spectrometer, an electron diffraction pattern obtained by a camera sensitive to electrons, the spectrum obtained by an electron energy loss spectrometer, or a cathodoluminescence detector.

In some embodiments, a change in the field of view is produced by moving the microscope stage and/or adding offsets to beam deflection to a new position defined by a set of position coordinates and while the field of view is in that position, data is accumulated from the electron and/or at least one auxiliary signal source and that data is either saved in its entirety or parameters are derived from the data and saved in a database together with the position coordinates.

The system may accordingly comprise a database for storing derived data from the signals acquired by either or both of the first and second detectors. The system may store this data together with corresponding position coordinates for the specimen, so that a user can easily locate on the specimen regions for which particular desirable properties for inspection or further analysis have been identified or derived, and may navigate thereto easily.

In some preferred embodiments, a display is generated from the database and used to show the value of one or more parameters at the position coordinates that have been previously been visited. The visual representation of the derived data or parameters at the corresponding stored position coordinates as they are represented on a specimen image, for instance, allows the system to provide to a user a map indicating derived properties overlaid upon the displayed compound image frames.

In such embodiments, typically the display covers the full range of positions visited by the user and for each set of position coordinates where data was recorded, for an attribute calculated from the data, the display uses a colour overlay on the same scale that covers an area that corresponds to the field of view that was scanned by the electron beam when data was recorded at that position. Thus the system may produce a labelled or annotated display comprising markings showing derived data for the regions visited or scanned by the electron microscope.

In some such embodiments, if the regions overlap, the attribute values used for the overlay and/or other attribute values from the data are used to aggregate, combine or sort the results from all overlapping regions. The system may be used to move the field of view around the specimen at such a rate that an acquired compound frame has a field of view that at least partially overlaps with the field of view of a previously acquired compound frame. The actual values or derived data for such overlapping compound image frames may accordingly be combined so as to provide improved data representing the relevant region of overlap to the user.

The system may build a specimen image based upon the image frames captured by the first or second detectors, or a further detector. Additionally, in some embodiments, the display is superimposed on a pre-acquired image of a large area of the specimen on the same scale or an image created using the saved data of at least one signal in the database.

BRIEF DESCRIPTION OF THE DRAWINGS

Examples of the present invention will now be described, with reference to the accompanying drawings, in which.

DESCRIPTION OF EMBODIMENTS

With reference to FIGS. 1-4 a method and system for analysing a specimen in an electron microscope according to the invention are now described.

Figure 2:
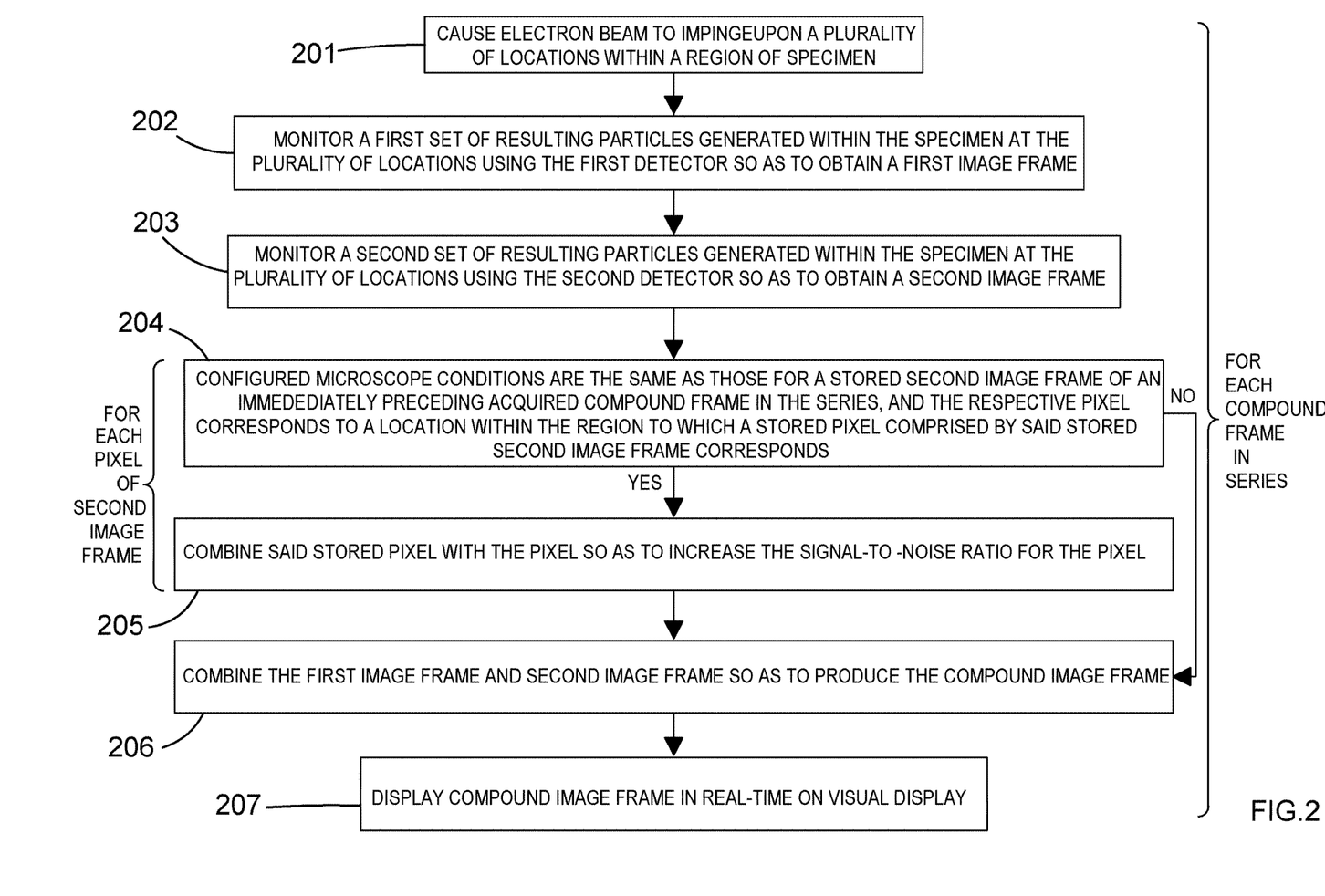
FIG. 2 is a flow diagram showing an example method according to the invention.
Figure 3:
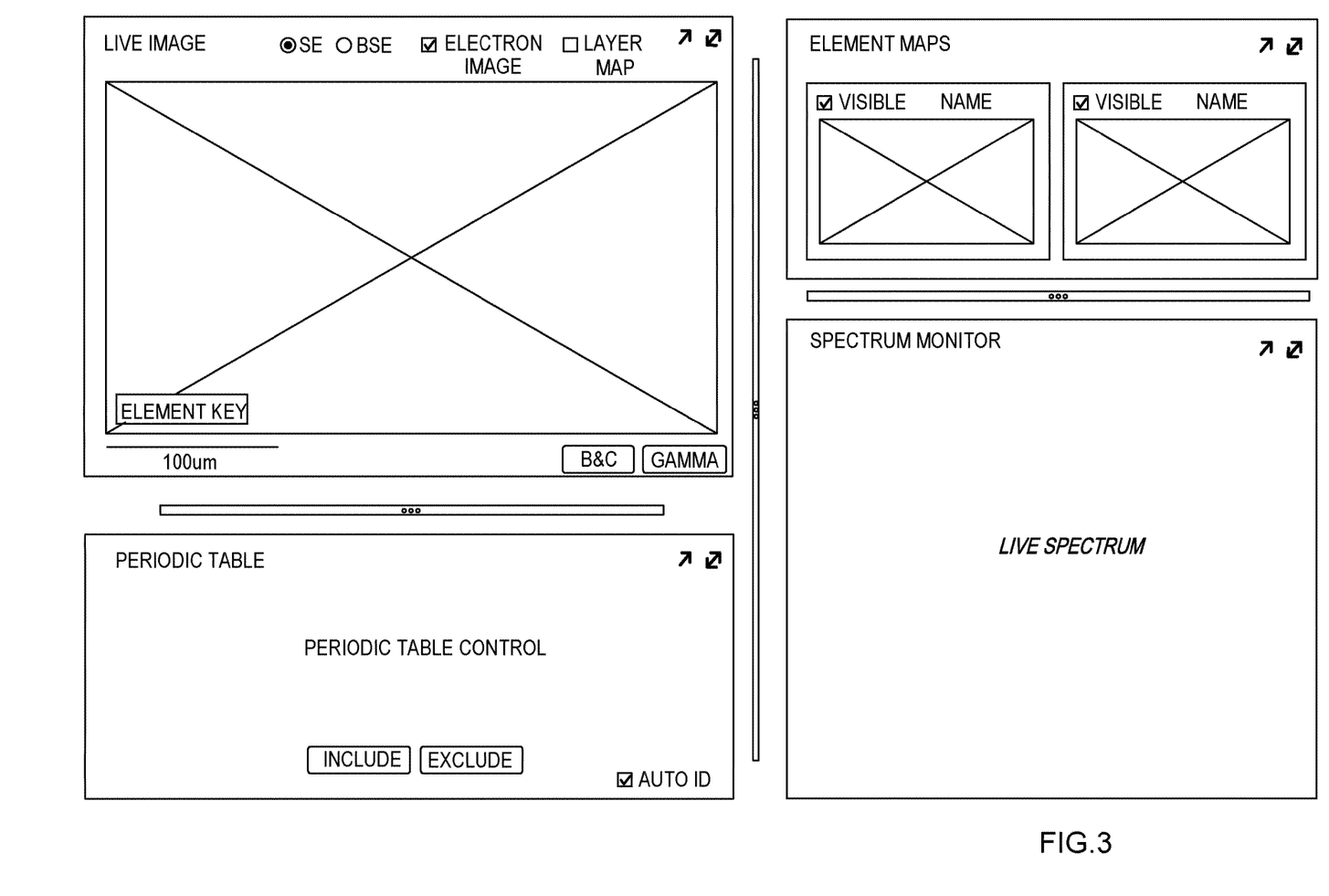
FIG. 3 is a wire frame showing the functional elements of a visual display screen for a user navigation in accordance with an example of the invention.

An example method, illustrated in the flow diagram of FIG. 2, may be performed using an electron microscope such as that of the arrangement shown in FIG. 1. The method involves acquiring a series of compound image frames, and the acquisition of a compound image frame is illustrated by the steps in FIG. 2. The compound image frames are acquired, in the present example, at a predetermined frequency. During the acquiring of frames, a user of the electron microscope system may be causing the field of view of the microscope to cover different regions of a specimen by moving the sample stage, and may periodically slow or stop the movement of the stage in order to accumulate second image frame data for specific regions of interest as they are discovered.

At step 201, the electron beam of the electron microscope is caused to impinge upon a plurality of locations within a region of specimen, by way of the beam being deflected so as to perform a raster scan of the region.

At step 202, a first set of particles generated within the specimen at the plurality of locations as a result of the electron beam impinging upon those locations is monitored using the first detector so as to obtain a first image frame. At step 203, a second set of resulting particles generated within the specimen at the plurality of locations as a result of the electron beam impinging upon those locations is monitored using the second detector so as to obtain a second image frame. As each location is struck by the electron beam, the first and second detectors monitor respective signals derived from the first and second sets of particles for that location. Thus steps 202 and 203 are performed substantially simultaneously. The signal from each detector is used to generate an image formed of pixels arranged such that the relative locations of the pixels correspond to the relative locations within the region of the locations at which the monitored particles from which the respective pixel values were generated.

As indicated at step 206, for each pixel in the second image frame, if the configured microscope conditions are the same as those for a stored second image frame of an immediately preceding acquired compound frame in the series, and if the respective pixel corresponds to a location within the region to which a stored pixel comprised by said stored second image frame corresponds, said stored pixel is combined with the pixel so as to increase the signal-to-noise ratio for the pixel. Thus those parts of the second image frame that correspond to parts of the specimen also present, having been monitored under the same microscope conditions, in a preceding second image frame in the sequence are captures and propagated to the compound image frame in "accumulation" mode (step 205). Otherwise, if the microscope conditions are not the same, or if the pixel does not correspond to a location within the region to which a stored pixel comprised by said stored second image frame corresponds, then that pixel of the second image frame is captured in "refresh" mode, and is not combined with stored pixels.

At step 206 the first image frame and second image frame are combined so as to produce the compound image frame, by overlaying the two images with one another such that the visual data from both image frames can be individually distinguished and related to the relevant part of the specimen region.

Once the compound image frame has been generated, at step 207 it is displayed in real-time on a visual display. In this example the compound image frame for the region is displayed 0.05 seconds after the completion of the raster scan for that region at step 202.

The above described steps are repeated for each compound image frame in the series as it is acquired.

In an electron microscope such as that of the arrangement shown in FIG. 1, there are many sources of signals that provide information on material composition or properties. Whereas the signal from a BSE detector in SEM (or annular dark field detector in STEM) is affected by the atomic number of atoms, it does not reveal any information about individual chemical element content and cannot uniquely identify a specific material present under the incident electron beam. However, an imaging camera sensitive to electrons can record an electron diffraction pattern that shows the variation in intensity of electrons with angular direction. Analysis of such a pattern can reveal properties of a crystalline material such as orientation or presence of a specific crystalline phase. If a thin specimen is being analysed, the energy spectrum for electrons transmitted through the film can be acquired with an electron energy loss spectrometer (EELS) and the presence of core loss edges in the spectrum can reveal the presence of individual chemical elements for example. An electron energy spectrometer can also be used to acquire spectra that reveal Auger emissions from a bulk sample that are characteristic of individual chemical element content. A detector sensitive to light can reveal areas where the sample is cathodoluminescent (CL) and this signal is influenced by the electronic structure of the material. An X-ray signal from a characteristic emission line from an individual chemical element can be obtained by using a crystal, diffraction grating or zone plate in a geometry that causes selective Bragg reflection of X-rays of that line energy towards a sensor sensitive to X-rays. All these are examples where the signal provides additional information on individual chemical element content or material properties that could be a useful auxiliary to an electron image from SE or BSE and could be used with the invention. However, the following description applies to the specific case where an X-ray spectrometer is used to provide additional information on chemical element content.

In an electron microscope it is typical to have one or more X-ray detectors and associated signal processors that enable an X-ray energy spectrum emitted by the specimen to be recorded. A histogram of photon energy measurements is recorded for the short time while the focussed electron beam is deflected to a particular pixel position. The histogram is equivalent to a digital X-ray energy spectrum and the number of photons acquired that correspond to characteristic X-ray emissions for particular chemical elements can be derived from the spectrum and this gives a set of signal values corresponding to a set of chemical elements. Furthermore, a signal from an electron detector (such as a secondary electron detector or a backscattered electron detector) can be recorded at that position. Thus, if the electron beam is deflected to set of pixel positions constituting one complete image frame, a set of pixel measurements can be obtained that correspond to a digital electron image and one or more images corresponding to different chemical elements. The data for these electron and X-ray images is scaled appropriately and passed to a video display unit, typically under control of a computer. FIG. 2 shows an example of a suitable display where the electron image is displayed at top left and one or more X-ray images corresponding to different chemical elements are displayed immediately to the right of the electron image so that they can be viewed at the same time that the user is concentrating on the electron image. To make it easier to view information simultaneously, the X-ray data from one or more chemical elements can be combined and displayed as a colour overlay on the electron image using techniques such as those described in PCT/GB2011/051060 or U.S. Pat. No. 5,357, 110 for example and in FIG. 3, the option to display the X-ray information overlaid on the electron image can be chosen by the user using a computer mouse to position a cursor inside the box marked "Layer Map" on the display and "clicking".

When the user wants to explore the specimen to find regions of interest, the field of view needs to be moved and the method of processing and displaying the images needs to be changed to give the user real time feedback that helps them explore the specimen efficiently while the field of view is changing.

The field of view can be changed by a number of methods. The microscope magnification can be increased by reducing the current supplied to the beam deflector coils (or voltage to beam deflector plates) so that size of the region scanned on the specimen is reduced. An offset can be added to the deflection or an additional set of deflectors used to shift the region scanned on the specimen. The specimen can be physically moved by moving the holder or stage supporting the specimen to a new position relative to the electron beam axis. In all these examples, the signal data obtained would correspond to different field of view on the specimen. Furthermore, if the user changed the operating voltage for the microscope, all the signal content would change.

When the field of view is being changed, the user needs to see a result as soon as possible and that is achieved by replacing the value at a pixel with the new result of signal measurement at the corresponding beam position so that the image is refreshed with each new frame of data. A high frame rate ensures that the image will be refreshed fast enough for the user to decide whether to continue with the change of field of view. A feature has to be visible in at least two successive frames for it to be tracked so if the field of view is moving, the frame time limits the speed at which objects can be tracked. If the frame refresh time is any longer than 1 second, the user will not feel in control and may not stay focussed on their train of thought. With a frame refresh time of 0.3 seconds, the user can track moving features quite well provided the feature only moves a small fraction of the screen width, but screen updates are noticeable. If the frame refresh time is less than 0.05 seconds, screen updates are hardly noticeable because of the user's persistence of vision. However, S/N is compromised at higher frame rates because the noise in an image for an individual frame will be worse when the dwell time per pixel is short. If the dwell time per pixel is increased to improve S/N, the frame time will also increase unless the number of pixels is reduced. However, reducing the number of pixels in a frame gives an image with less spatial resolution. Therefore, the dwell time per pixel and number of pixels per frame need to be optimised to suit the image signal source and the required speed of movement of the field of view.

When the field of view is moving, a short frame refresh time is highly desirable because it makes it easier for the user to track moving features and make decisions to navigate to different regions. However, when the user stops moving the field of view, the refreshed image may be noisy if a short frame time is used. Thus there is a contradicting requirement for best performance for moving and static fields of view. To overcome this contradiction we change the way data is used and switch from a "refresh" mode while the field of view is moving to an "averaging" mode when the field of view is stationary.

When the field of view is not being moved, the new result obtained when the focussed electron beam returns to a particular position is now combined with the existing value in the corresponding pixel to improve the overall S/N ratio. An X-ray signal is typically the number of photons of a particular characteristic energy recorded in the pixel dwell time and the new count can simply be added to the existing count so that the pixel value represents a total count which accumulates with every new frame of data. For display, the total count is simply divided by the number of frames for which the "averaging" mode has been used so that the intensity stays constant but the S/N improves because of the reduction in Poisson counting noise. Alternative implementations can be used to provide S/N improvement of any signal when the system is in "averaging" mode. For example, a "Kalman" recursive filter for a particular pixel can be described as follows:

$$Y(N)=A*S(N)+(1-A)*Y(N-1)$$

where S(N) is the signal for the Nth incoming frame of image data, Y(N−1) is the previous value in the pixel and Y(N) is the new value for the pixel and A is less than or equal to 1. If A=1, this is effectively equal to the "refresh" mode but smaller values of A provide an averaging effect which weights the most recent result highly and previous frames with weights that decay exponentially so that the overall effect is of a long persistence screen. However, starting at a particular point in time, optimal noise reduction is obtained by changing A for each successive frame of data so that A=1/N and this produces the same S/N reduction as averaging with equal weighting over all frames.

A key requirement to enable a seamless transition between "refresh" and "averaging" modes is for the system to know when the user is moving the field of view. If the computer than controls signal acquisition is also aware of user requests to adjust the field of view or microscope conditions, then it can immediately decide which acquisition mode to use. Otherwise, the control computer has to deduce whether the field of view is changing. In this case, the first frame of electron image data is saved and each successive frame of electron image data is compared to the first frame to see if it is different. As soon as a significant shift is detected (for example by observing the offset of the maximum in the cross correlation of the two images), then the system switches to "refresh" mode and will remain in this mode until two successive images show no significant shift when the system reverts to "averaging" mode. This type of test is ideal if the user is moving the specimen stage under the beam so that a shift of the field of view will definitely occur. It is also effective at detecting a change in magnification between two images because this will usually still produce a change in the maximum of the cross correlation result. Other tests can be used to detect changes in microscope conditions. For example, the centroid and standard deviation of a histogram of the digital image will change if the brightness or contrast is altered, as will be the case when the electron beam energy is altered by changing microscope accelerating voltage. Also, changes in focus can be detected by observing changes in the frequency distribution in the power spectrum of the digital image. Similar methods can be used to detect differences between X-ray images for a particular chemical element. Alternatively, an X-ray image can be generated that uses the signal from the total X-ray spectrum recorded at each pixel so that the image has better S/N than an image for a particular chemical element. Differences in this total X-ray spectrum image can then be used to detect changes in the field of view or conditions. The sensitivity of these tests depend on the S/N of the image and the criteria for detecting a change need to be adjusted to give the best compromise between slow response to changes and false detection when there is no change. Therefore, wherever possible, it is preferable to arrange that the computer knows when the user has intentionally changed the scanned region so that the correct mode of acquisition can be selected without having to test for image differences.

Whenever the field of view and microscope conditions are stationary, X-ray spectrum data is acquired for every pixel and this data accumulates as successive frames of image data are combined to improve S/N while in "averaging" mode. When a change to the field of view is introduced or detected, acquisition is going to be switched to "refresh" mode and at this point the accumulated X-ray spectrum data forms an X-ray "spectrum image" where every pixel has an associated X-ray energy spectrum for that pixel location. The sum of all pixel spectra in the field of view forms a single "sum spectrum" that can be processed to automatically identify ("Auto-ID") chemical elements from characteristic emission peaks appearing in the spectrum. The accuracy of Auto-ID can be improved by correcting the sum spectrum for pulse pile-up effects using techniques described in patent application PCT/GB2014/051555. As in PCT/GB2014/051555, clustering techniques can also be used to identify sets of pixels that have similar spectra and analysis of the sum of all the spectra from one set of similar pixels can either be used to find a matching entry in a library of spectra, or the summed spectrum analysed to quantity element compositions that can be used to match a library of compositions of known compounds so that the compound can be identified. Thus, at the point just before the field of view is altered, an X-ray spectrum image is available from the current field of view and chemical elements or even compounds can be detected within that field of view. If the field of view is being controlled by movement of the holder or stage supporting the specimen, stage coordinates (e.g. X, Y, Z) will define the position of the field of view while the extent of the field in X and Y is defined by the beam deflection. If beam deflection is used to offset the field of view from the central position, there will be additional coordinates defining the beam deflection. The combination of stage and beam coordinates and size of the region scanned on the specimen surface are saved in a database together with the list of elements or compounds detected and if storage space allows, the entire X-ray spectrum image for that field of view.

When the field of view is being moved, at the end of each frame time there will be a new X-ray spectrum image corresponding to a single frame of data but the field of view will be effectively stretched along the direction of movement and the pixel data do not correspond to precise locations on the specimen. However, the sum spectrum for the single frame can be processed to Auto-ID chemical elements that have been detected in the field of view during the movement and get a measure of average concentration of each element over the stretched field of view. The detected elements and concentration values are saved in the database together with the suitable stage and beam coordinates and size of the region that was scanned in this frame.

After the exploring session, this database can be interrogated to find "interesting" fields of view where particular elements or compounds of interest have been detected and the user can drive the stage back to one of those locations and restore the beam deflection parameters so that that further data can be acquired from that field of view. To aid the user in navigating back to a region that contains interesting features, an overview map can be generated from the database and used to show the presence of an element or compound of interest at all the field of view positions that have been visited in the analysis session. Where possible, this overview map covers the full range of stage movement accessible to the user and for each position where data was recorded in the database will display the values for any requested parameter of interest that can be derived from the data. For example, if a particular chemical element is of interest, either the spectrum image from the field of view scanned at that region can be processed to provided intensity values for that chemical element at every pixel, or if the spectrum image has not been saved, then if the requested chemical element was detected somewhere in that field of view, then a coloured box can be drawn covering the field of view. The intensity of the colour can be made proportional to the amplitude of the peak detected in the sum spectrum for the field of view and when two fields of view overlap that have the same element detected, the intensity in the region of overlap can be set to the maximum intensity of the two fields. Ideally, before the overview map is constructed, the background to the overview map is replaced by an image of the specimen to help the user see the relationship of interesting fields of view to visible structures in the specimen. That image can be obtained for example by acquiring a series of electron images at different stage positions and stitching the images together to form a montage image that covers the complete range of stage movement. Alternatively, a digital image of the specimen obtained with an optical microscope may be obtained that includes fiducial marks and the relationship between stage position and coordinates in the digital optical image used to affine transform the optical image on to the stage coordinate system used for the overview map.

Figure 4:
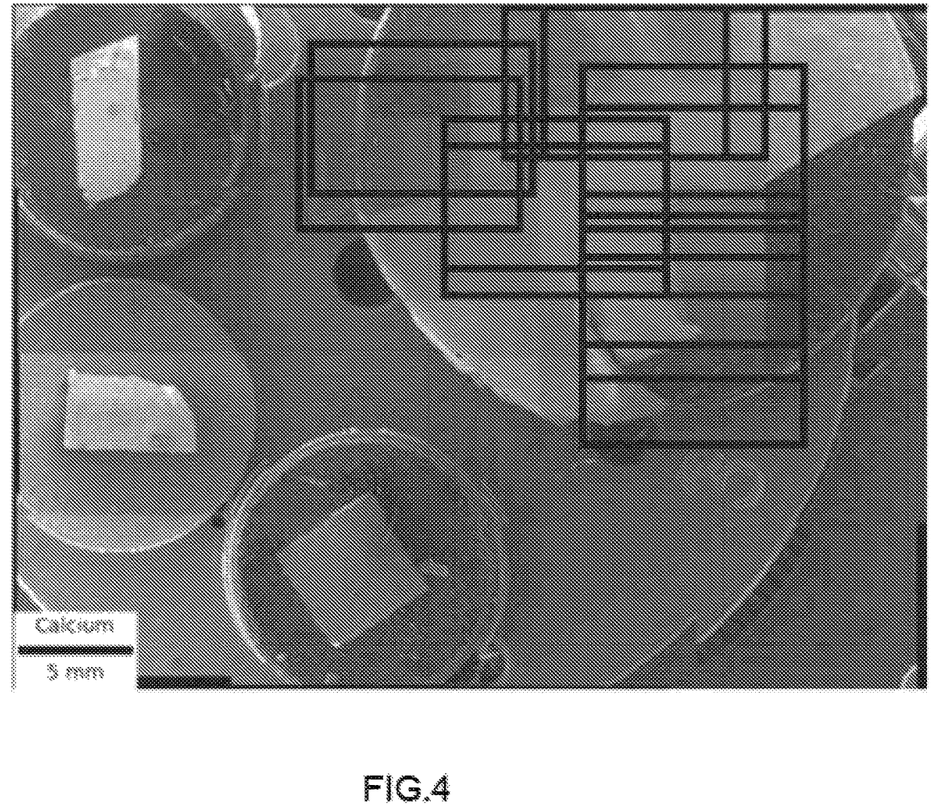
FIG. 4 shows an example specimen image formed from a plurality of acquired compound image frames with indicia showing regions of the specimen wherein a chemical element has been detected by way of an example of the invention.

FIG. 4 shows an example of such an overview map. The background image has been obtained by moving the stage a few cm in each direction and acquiring a series of digital electron images and stitching them together to form a montage. The rectangular boxes show the outline of the fields of view that were being scanned by the electron beam when the element calcium was detected in the X-ray spectrum from that field while the user was exploring the specimen and the stage was momentarily stationary. On the real display, the box outlines do not appear but each rectangle is coloured (in red for example) with intensity proportional to the counts measured in the Ca K characteristic peak in the sum spectrum. Where rectangles overlap, the colour intensity corresponds to the maximum for any overlapping regions. No box is drawn if Ca K was not detected in the sum spectrum for any region. Thus, the overlapping boxes form a "snail trail" that shows where the user has previously been exploring and the system has detected calcium. If there is a small region containing calcium then some fields of view may only partially include the region and therefore the Ca K counts recorded in the sum spectrum for the field will be lower than for a field that includes the whole calcium-rich feature. Therefore, the appearance of the overview image is of a "heat map" where if the intensity is strong there is a higher probability of finding calcium in that region. If there is sufficient storage available to save the complete spectrum image for each field of view whenever the stage is stationary, then rather than using the same colour for the whole rectangle, the Ca K counts recorded in individual pixels can be coloured with intensity proportional to the number of counts and this provides a higher resolution "heat map" for the element.

The invention claimed is:
1. A method for analyzing a specimen in a microscope, the method comprising:
  acquiring a series of compound image frames using an electron detector and a second detector, the second detector comprising any of an X-ray spectrometer, an electron diffraction pattern camera, an electron energy loss spectrometer, or a cathodoluminescence detector, wherein acquiring a compound image frame comprises:
    a) causing a charged particle beam to impinge upon a plurality of locations within a region of a specimen, the region corresponding to a configured field of view of the microscope, the microscope being configured with a set of microscope conditions,
    b) monitoring, in accordance with the configured microscope conditions, a first set of resulting particles generated within the specimen at the plurality of locations using the electron detector so as to obtain a first image frame,
    c) monitoring, in accordance with the configured microscope conditions, a second set of resulting particles generated within the specimen at the plurality of locations using the second detector, so as to obtain a second image frame, wherein each image frame comprises a plurality of pixels corresponding to, and having values derived from the monitored particles generated at, the plurality of locations within the region,
    d) for each pixel of the second image frame:
      when the configured microscope field of view is different from that for an immediately preceding compound image frame in the series, using the value of the pixel to replace the value for a corresponding pixel in a stored second image frame; and
      when the configured microscope field of view is the same as that for the immediately preceding compound image frame in the series, combining the value of the pixel with the value of the corresponding pixel in the stored second image frame so as to increase the signal-to-noise ratio for the corresponding pixel of the stored second image frame, and
    e) combining the first image frame and stored second image frame so as to produce the compound image frame, such that the compound image frame provides data derived from, for each of the plurality of pixels, the particles generated at the corresponding location within the region and monitored by each of the electron detector and the second detector;
  and displaying the series of compound image frames in real-time on a visual display,
  wherein steps (b) and (c) are performed substantially simultaneously; and
  wherein the visual display is updated to show each compound image frame in sequence so as to allow an observer to identify potential features of interest when the field of view is changing.

2. A method according to claim 1, wherein the electron detector is adapted to monitor resultant particles that provide data including either or both of topographical information and specimen material atomic number information about the region of the specimen.

3. A method according to claim 1, wherein:
  monitoring the second set of particles so as to obtain the second image frame comprises obtaining two or more signals of different types from the second detector so as to obtain a sub-image frame corresponding to each of the two or more signals; and
  combining the first image frame and second image frame comprises combining the first image frame with one or more of the sub-image frames.

4. A method according to claim 1, wherein monitoring the second set of particles so as to obtain the second image frame comprises:
  monitoring two or more sub-sets of the second set of particles, each of the sub-sets corresponding to a different particle energy range, so as to obtain a sub-image frame corresponding to each of the sub-sets,
  wherein each sub-image frame comprises a plurality of pixels corresponding to, and having values derived from the monitored sub-set of particles generated at, the plurality of locations within the region; and
  combining the sub-image frames together so as to produce the second image frame such that the second image frame provides data derived from, for each of the plurality of pixels, the sub-sets of particles generated at the corresponding location within the region.

5. A method according to claim 1, wherein displaying the series of compound image frames in real-time comprises updating the visual display to show each compound image frame in less than 1 second.

6. A method according to claim 1, wherein combining the first image frame and second image frame so as to produce the compound image frame comprises overlaying the first and second image frames such that the compound image frame comprises a plurality of pixels, each corresponding to one of the plurality of locations within the region, providing data derived from the first set and the second set of particles generated at the respective location.

7. A method according to claim 6, wherein combining the first image frame and second image frame comprises calculating a color for each pixel of the combined image frame that is based on the intensities of the corresponding combined pixels in the first and second image frames.

8. A method according to claim 6, wherein combining the first image frame and second image frame comprises assigning a first color to the first image frame and a second, different color to the second image frame, such that the compound image frame comprises a color image wherein the relative intensities at each pixel of the first and second color represent the particles comprised by the first and second sets of monitored particles, respectively, generated at the corresponding location within the region.

9. A method according to claim 1, wherein:
each location within the region of the second image frame corresponds to a location within the region of the first image frame; and
combining the first image frame and second image frame so as to produce the compound image frame comprises combining each pixel at each location within the region of the first image frame with the pixel at the corresponding location within the region of the second image frame.

10. A method according to claim 1, wherein combining the first image frame and second image frame so as to produce the compound image frame comprises juxtaposing the first and second image frames.

11. A method according to claim 1, wherein the microscope conditions comprise any of: magnification, focus, astigmatism, accelerating voltage, beam current, and scan deflection configured for the charged particle beam, position and orientation configured for the specimen, and brightness and contrast configured for each of the electron detector and the second detector.

12. A method according to claim 1, wherein the rate at which the series of compound image frames is acquired and displayed is at least 1 frame per second.

13. A method according to claim 1, wherein combining the value of the pixel with the value of the corresponding pixel in the stored second image frame comprises signal averaging or signal accumulation.

14. A method according to claim 1, further comprising, during the acquiring of the series of compound image frames:
storing data derived from one or more of the compound image frames; and
storing field of view data representing the configured field of view of the microscope such that the stored derived data is associated with the stored field of view data.

15. A method according to claim 14, further comprising;
acquiring at least one compound image frame of each of a plurality of regions of the specimen;
generating a specimen image comprising the compound image frames of the plurality of regions arranged according to the relative positions of the regions on the specimen; and
displaying, on the specimen image, indicia at each of one or more of the compound image frames according to the stored derived data associated with the field of view corresponding to the respective compound image frame.

16. A system for analyzing a specimen, the system comprising:
a microscope comprising:
an electron detector; and
a second detector, the second detector comprising any of an X-ray spectrometer, an electron diffraction pattern camera, an electron energy loss spectrometer, or a cathodoluminescence detector;
a controller unit configured to control the microscope to acquire a series of compound image frames, wherein acquiring a compound image frame comprises:
a) causing a charged particle beam to impinge upon a plurality of locations within a region of a specimen in the microscope, the region corresponding to a configured field of view of the microscope, the microscope being configured with a set of microscope conditions,
b) monitoring, in accordance with the configured microscope conditions, a first set of resulting particles generated within the specimen at the plurality of locations using the electron detector so as to obtain a first image frame,
c) monitoring, in accordance with the configured microscope conditions, a second set of resulting particles generated within the specimen at the plurality of locations using the second detector, so as to obtain a second image frame, wherein each image frame comprises a plurality of pixels corresponding to, and having values derived from the monitored particles generated at, the plurality of locations within the region,
d) for each pixel of the second image frame:
when the configured microscope field of view is different from that for an immediately preceding compound image frame in the series, using the value of the pixel to replace the value for a corresponding pixel in a stored second image frame; and
when the configured microscope field of view is the same as that for the immediately preceding compound image frame in the series, combining the value of the pixel with the value of the corresponding pixel in the stored second image frame so as to increase the signal-to-noise ratio for the corresponding pixel of the stored second image frame, and
e) combining the first image frame and stored second image frame so as to produce the compound image frame, such that the compound image frame provides data derived from, for each of the plurality of pixels, the particles generated at the corresponding location within the region and monitored by each of the electron detector and the second detector;
and a visual display configured to receive and display the acquired series of compound image frames in real-time,
wherein steps (b) and (c) are performed substantially simultaneously, and
wherein the visual display is updated to show each compound image frame in sequence so as to allow an observer to identify potential features of interest when the field of view is changing.

17. A system according to claim 16 for displaying signals generated while a focused electron beam in an electron microscope is scanned over a two dimensional region on the surface of the specimen wherein:
- at least one auxiliary signal is derived from a different detector that provides information on individual chemical element content or material properties other than atomic number,
- each signal is measured at a two-dimensional array of electron beam positions covering the region and the corresponding pixel array of measurement results constitutes a digital image for a field of view covering the region,
- a visual display is used to show the digital images for all signals or a single composite color image generated by combining all signals,
- a complete set of pixel measurements covering the field of view for all signals and preparation of the visual display is performed and completed in a short time period,
- the complete set of pixel measurements for all signals covering the field of view and updating of the visual display are repeated continuously,
- when the field of view or microscope conditions are not changing, successive measurements of the at least one auxiliary signal at the same pixel position are used to improve the signal-to-noise of the measurement at that pixel,
- when the field of view or microscope conditions changes, the next measurement of a signal at the same pixel position is used to replace the previous measurement, and
- the short time period is sufficiently small that image displays are updated fast enough for the observer to identify moving features when the field of view is being altered.

18. A system according to claim 16 or claim 17, wherein the signal-to-noise of the displayed result of more than one measurement of a signal is improved by using Kalman averaging of the measurements or by summing measurements and altering the brightness scaling according to the number of measurements.

19. A system according to claim 17, wherein the short time period is less than 1 second.

20. A system according to claim 17, wherein the field of view changing comprises moving the specimen or changing the scanned region.

21. A system according to claim 17, wherein a change in the field of view or microscope conditions is detected by mathematical comparison of a digital image with one acquired earlier.

22. A system according to claim 16, wherein an auxiliary signal is derived from the spectrum obtained by an X-ray spectrometer, an electron diffraction pattern obtained by a camera sensitive to electrons, the spectrum obtained by an electron energy loss spectrometer, or a cathodoluminescence detector.

23. A system according to claim 20, wherein a change in the field of view is produced by moving the microscope stage and/or adding offsets to beam deflection to a new position defined by a set of position coordinates and w-hile the field of view is in that position, data is accumulated from the electron detector and/or the different detector and that data is either saved in its entirety or parameters are derived from the data and saved in a database together with the position coordinates.

24. A system according to claim 23, wherein a display is generated from the database and used to show the value of one or more parameters at the position coordinates that have previously been visited.

25. A system according to claim 24, wherein the display covers the full range of positions visited by the user and, for an attribute calculated from the data at each set of position coordinates where data was recorded, the display uses a color overlay on the same scale that covers an area that corresponds to the field of view that was scanned by the electron beam when data was recorded at that position.

26. A system according to claim 25, wherein if the regions overlap, the attribute values used for the overlay and/or other attribute values from the data are used to aggregate, combine or sort the results from all overlapping regions.

27. A system according to claim 24, wherein the display is superimposed on:
- a pre-acquired image of a large area of the specimen on the same scale; or
- an image created using the saved data of at least one signal in the database.

* * * * *